United States Patent
Joo

(10) Patent No.: US 10,667,415 B2
(45) Date of Patent: May 26, 2020

(54) COUPLING MECHANISM FOR COUPLING ELECTRONIC DEVICE

(71) Applicant: LSIS CO., LTD., Anyang-si, Gyeonggi-do (KR)

(72) Inventor: Sang-Oh Joo, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 16/277,359

(22) Filed: Feb. 15, 2019

(65) Prior Publication Data
US 2019/0261522 A1    Aug. 22, 2019

(30) Foreign Application Priority Data

Feb. 21, 2018    (KR) .................. 10-2018-0020405

(51) Int. Cl.
*H05K 5/02*    (2006.01)
*G06F 1/16*    (2006.01)
(Continued)

(52) U.S. Cl.
CPC ......... *H05K 5/0208* (2013.01); *G06F 1/1607* (2013.01); *G06F 1/183* (2013.01);
(Continued)

(58) Field of Classification Search
CPC ...... G06F 1/1601; G06F 1/1607; G06F 1/183; H05K 5/0217; H05K 5/0017; H05K 5/03;
(Continued)

(56) References Cited

U.S. PATENT DOCUMENTS

| 4,754,533 A | 7/1988 | Awakowicz et al. |
| 6,826,863 B1 * | 12/2004 | Goodfellow .......... G06F 1/1607 248/918 |

FOREIGN PATENT DOCUMENTS

| DE | 102016102138 A1 | 8/2017 |
| JP | H0786765 A | 3/1995 |

(Continued)

OTHER PUBLICATIONS

European Search Report for related European Application No. 19158107.3; action dated Jul. 18, 2019; (8 pages).
(Continued)

*Primary Examiner* — James Wu
(74) *Attorney, Agent, or Firm* — K&L Gates LLP

(57) ABSTRACT

A coupling mechanism for coupling an electronic device to an outer casing includes a plurality of hook-shaped brackets interposed between a front cover and a rear cover of the electronic device, where the plurality of hook-shaped brackets pass through an accommodation hole of the outer casing and are held to hook the outer casing while the front cover and the rear cover are coupled to each other; a plurality of main bracket-mounted portions defined in the front cover, where each of the plurality of hook-shaped brackets is mounted into each of the plurality of main bracket-mounted portions; and a plurality of auxiliary bracket-mounted portions disposed on the rear cover, where each of the plurality of auxiliary bracket-mounted portions is engaged with each of the plurality of hook-shaped brackets when the front cover and the rear cover are coupled to each other.

7 Claims, 8 Drawing Sheets

(51) Int. Cl.
*H05K 5/00* (2006.01)
*H02B 1/00* (2006.01)
*G06F 1/18* (2006.01)

(52) U.S. Cl.
CPC ............. *H02B 1/00* (2013.01); *H05K 5/0017* (2013.01); *H05K 5/0217* (2013.01)

(58) Field of Classification Search
CPC ............ H05K 5/0208; G02F 1/133308; G02F 2201/465; G02F 2001/133322; H02B 1/00
See application file for complete search history.

(56) References Cited

FOREIGN PATENT DOCUMENTS

| | | |
|---|---|---|
| JP | H11268595 A | 10/1999 |
| JP | 2004214223 A | 7/2004 |
| JP | 2012028493 A | 2/2012 |
| JP | 2014116462 A | 6/2014 |
| JP | 2014192410 A | 10/2014 |
| KR | 20080019472 A | 3/2008 |
| KR | 20180101821 A | 9/2018 |

OTHER PUBLICATIONS

Korean Notice of Allowance for related Korean Application No. 10-2018-0020405; action dated Apr. 29, 2019; (5 pages).
Japanese Office Action for related Japanese Application No. 2019-017096; action dated Mar. 3, 2020; (4 pages).

\* cited by examiner

【FIG. 1】
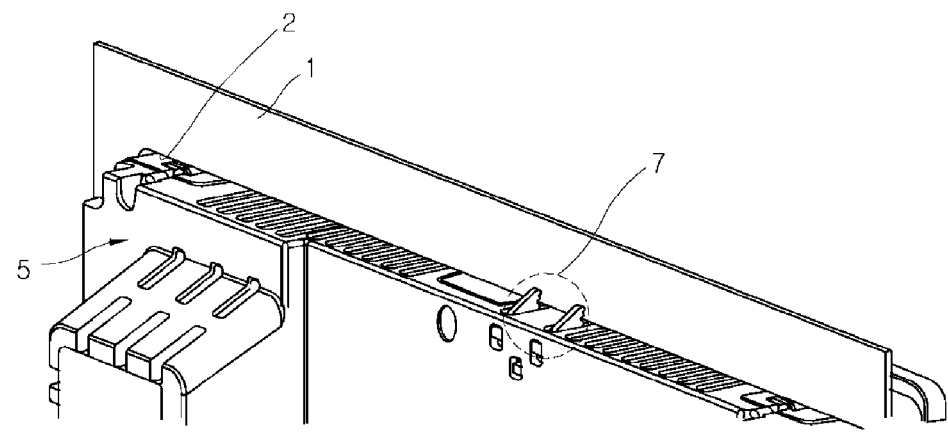
<Prior Art>
【FIG. 2】
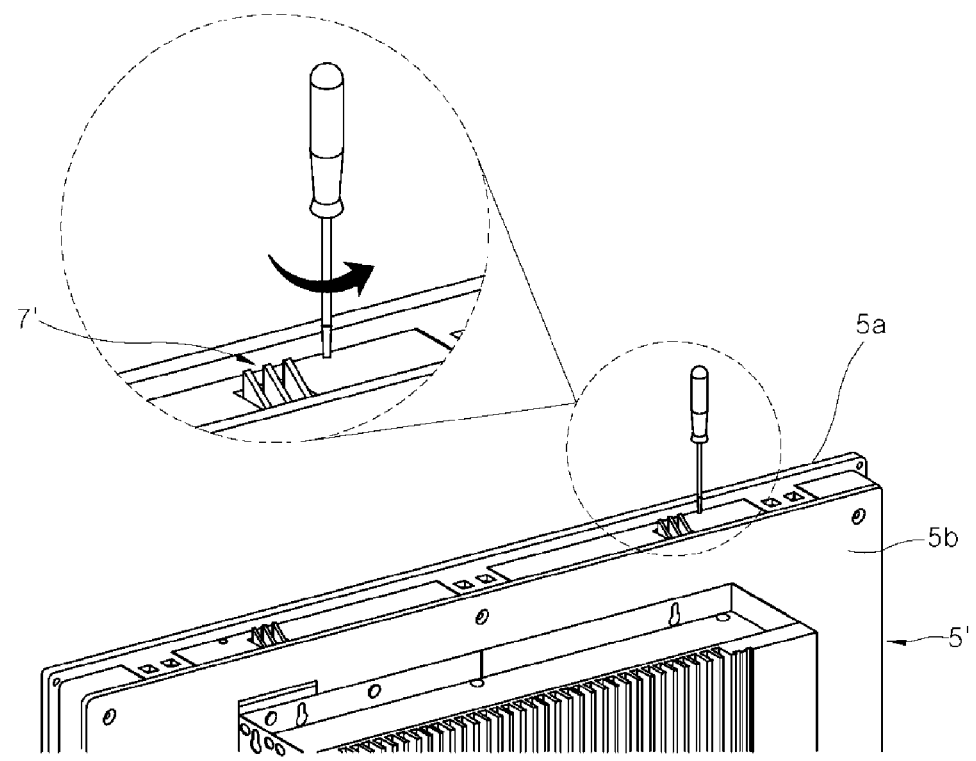
<Prior Art>

[FIG. 3]
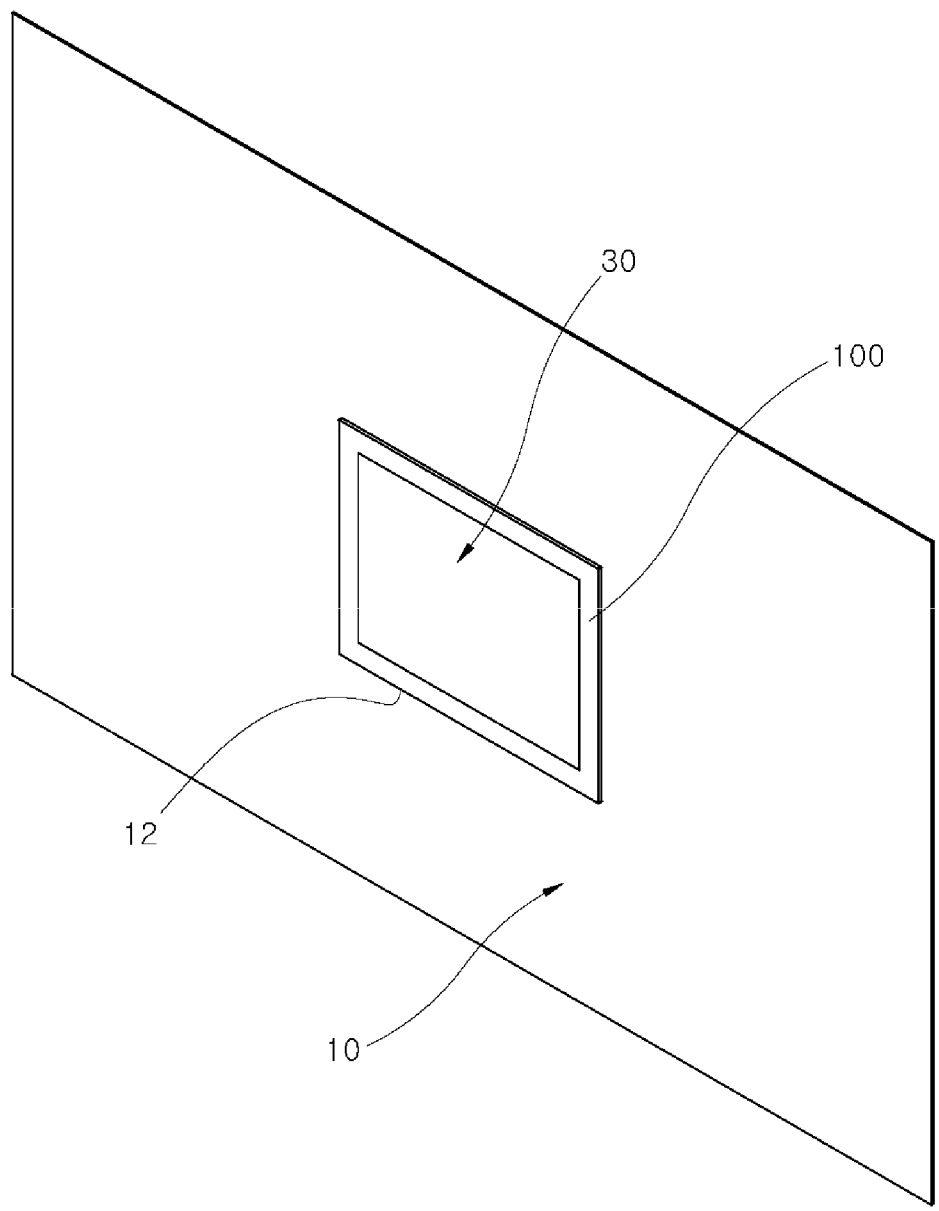

【FIG. 4】
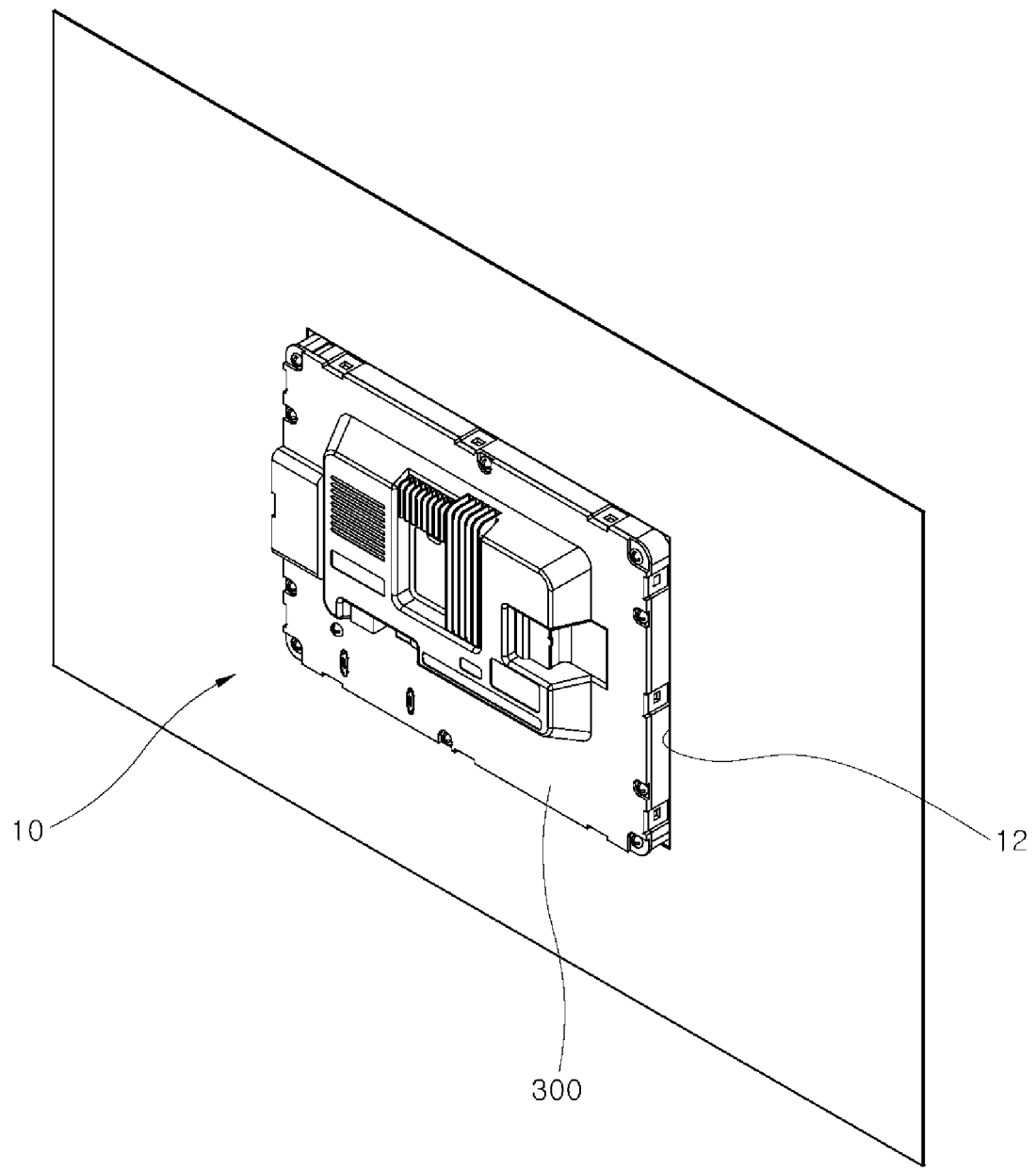

[FIG. 5]
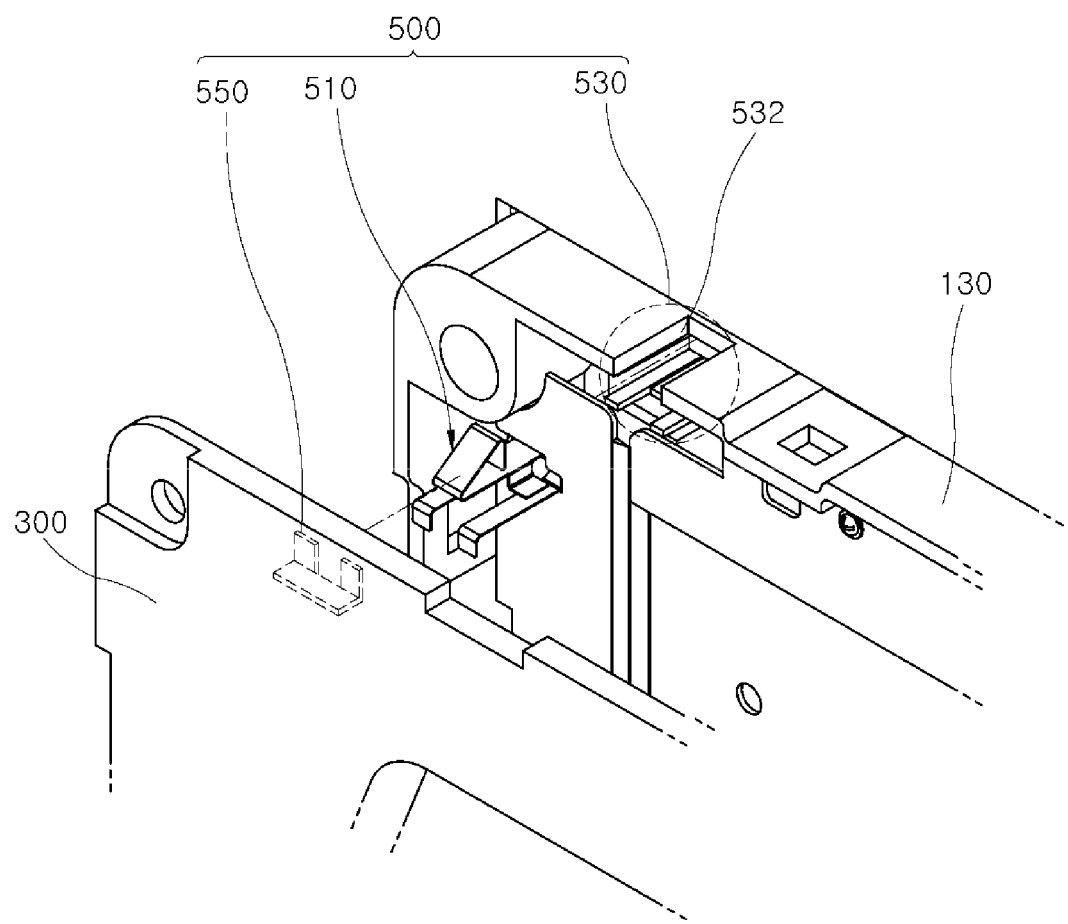

[FIG. 6]
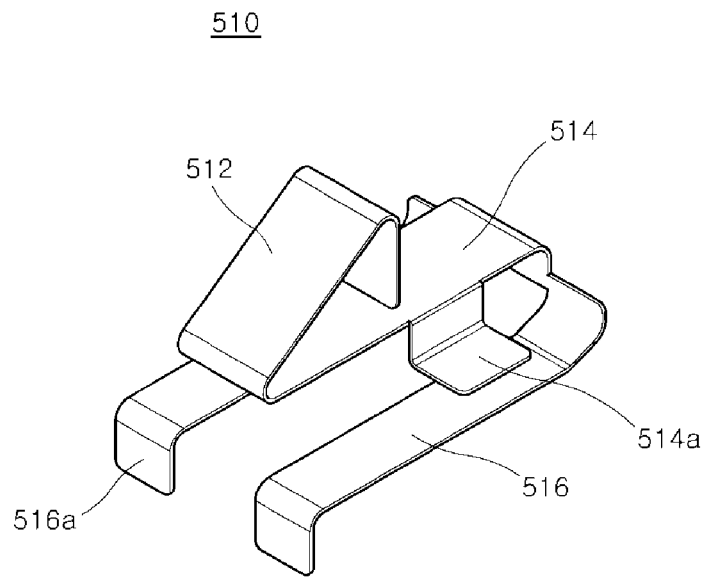
[FIG. 7]
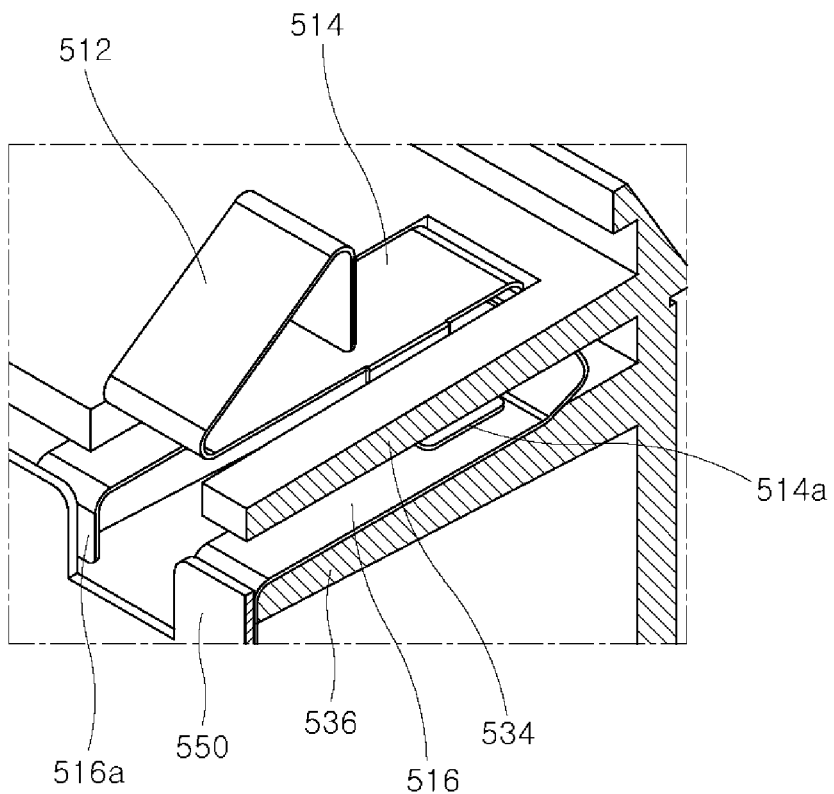

[FIG. 8]
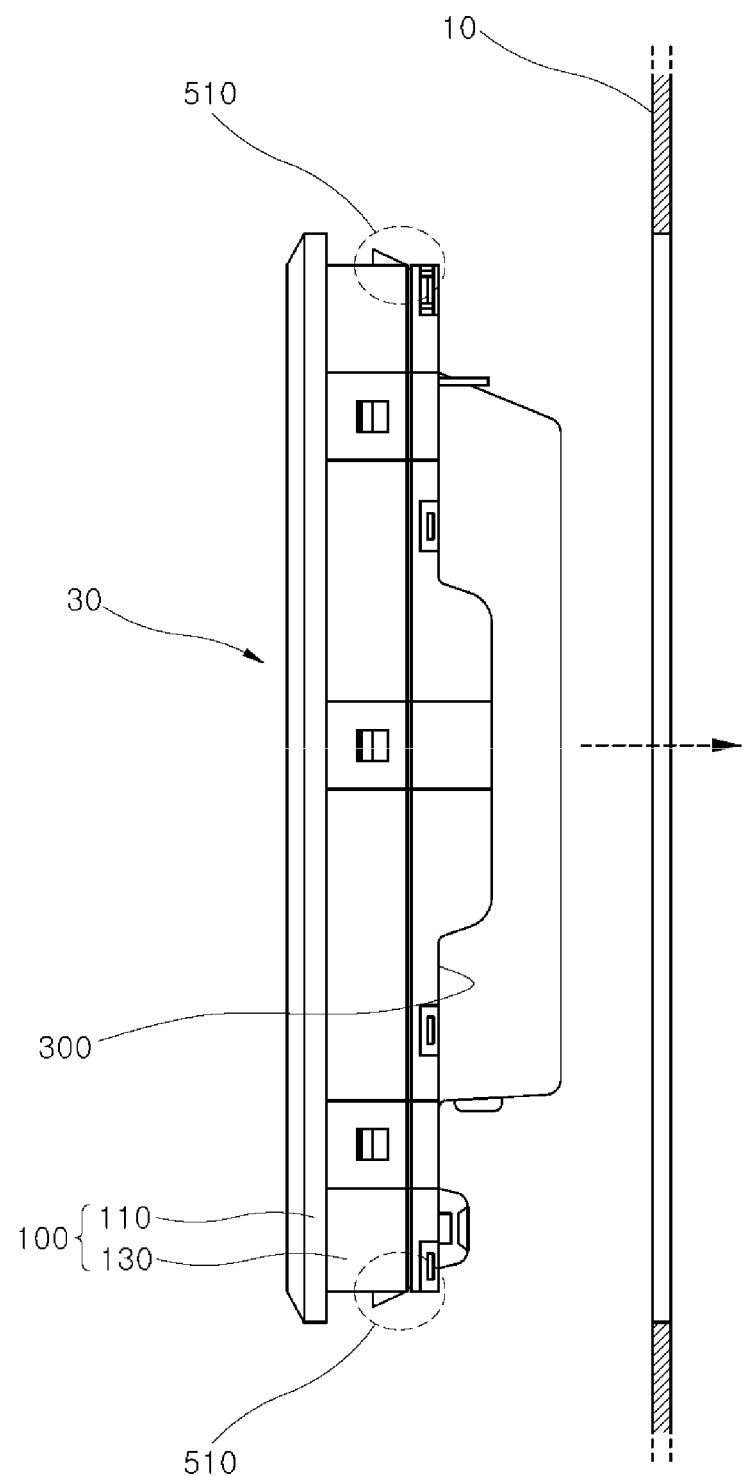

[FIG. 9]
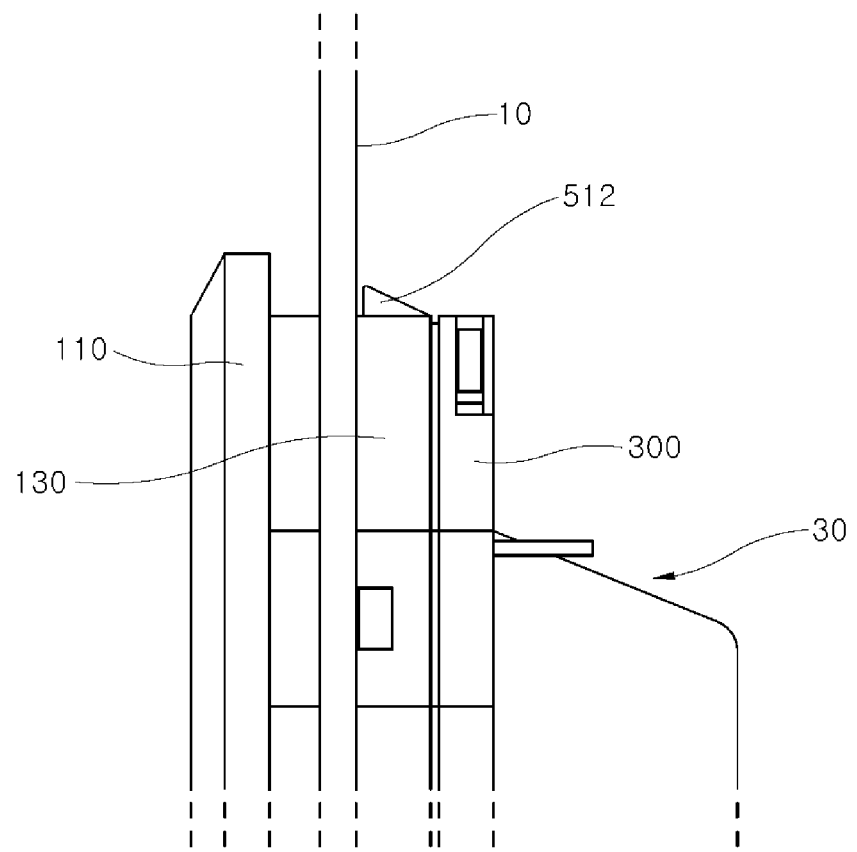

[FIG. 10]
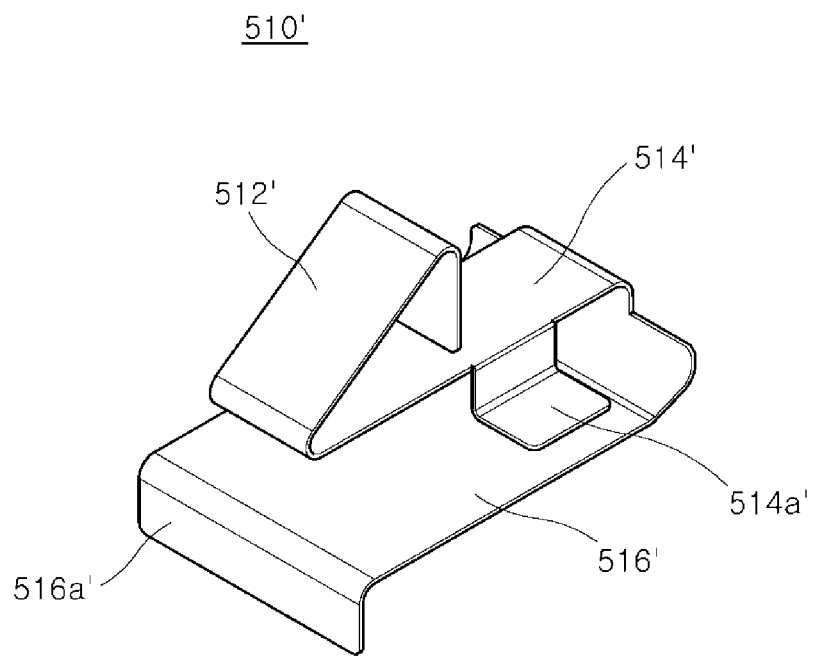
[FIG. 11]
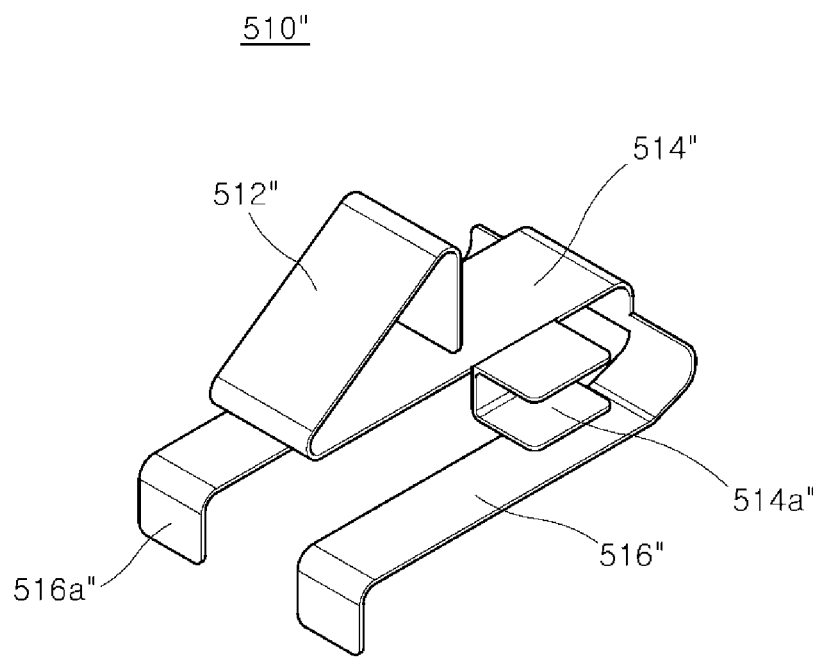

COUPLING MECHANISM FOR COUPLING ELECTRONIC DEVICE

CROSS-REFERENCE TO RELATED APPLICATION

Pursuant to 35 U.S.C. § 119(a), this application claims the benefit of earlier filing date and right of priority to Korean Application No. 10-2018-0020405, filed on Feb. 21, 2018, in the Korean Intellectual Property Office, the disclosure of which is incorporated herein in its entirety by reference.

TECHNICAL FIELD

The present disclosure relates to a coupling mechanism capable of pre-coupling an electronic device to an outer casing so that the outer casing and the electronic device are not separated from each other before the electronic device is completely mounted on the outer casing.

BACKGROUND

In general, a HMI (Human Machine Interface) device or panel PC means a multifunctional control device in a form of a panel excluding integrated mechanical elements such as a hard disk, a CD driver, a cooling fan, etc. such that the device may be easily used by a field worker.

The HMI device is provided in various forms including a fixed panel form in which the device may be fixed to a panel and a removable panel form in which the operator removes the device from the panel.

FIG. 1 shows a conventional coupling structure for an electronic device. FIG. 2 shows another conventional coupling structure for an electronic device.

As shown in FIG. 1, when installing an electronic device 5 such as an HMI device or panel PC, an operator first inserts the electronic device 5 into a mounting hole 2 defined in an outer casing 1. Thereafter, a hook-shaped bracket 7 formed on the electronic device 5 is hooked into the outer casing 1. Thus, the electronic device 5 may be prevented from being separated from the outer casing 1. In this connection, the bracket 7 is made of plastic. The hook-shaped portion passes through a hole defined in a front cover or rear cover of the electronic device 5 and is inserted into the hole 2 and caught into the outer casing 1. Further, the front or rear cover is detachable. An unexposed portion of the bracket 7 may be typically composed of 3 to 5 coupling parts such as springs, pins, and the like.

Alternatively, as shown in FIG. 2, for assembling an electronic device 5', a bracket 7' having a plurality of hooks is mounted between a front cover 5a or a rear cover 5b. Then, the front cover 5a and the rear cover 5b are coupled with each other via separate fastening bolts. The electronic device 5' is then installed onto the outer casing 1. In this case, a construction and material of the bracket 7' are the same as in FIG. 1.

However, since the conventional bracket for the electronic device is made of a plastic material, there is a risk that the hook-shaped portion of the bracket is bent or broken when the bracket is inserted into the mounting hole in the outer casing. Since the hook-shaped bracket is composed of the 3 to 5 parts, the assembling process is complicated and the cost of the bracket is increased.

Further, for an electronic device without a hook-shaped bracket, while one operator must keep a state in which the electronic device is inserted into the outer casing, another operator must work to fix the electronic device onto a back of the outer casing. Therefore, it is difficult to install the electronic device by one operator. Further, the assembling time is extended.

SUMMARY

In order to solve the problem, a purpose of the present disclosure is to provide a coupling mechanism for coupling an electronic device to an outer casing by which one operator can easily mount the electronic device into the outer casing.

Another purpose of the present disclosure is to provide a coupling mechanism for coupling an electronic device to an outer casing in which a structure of a bracket is improved to reduce a cost and to simplify an assembly process and to reduce an assembly time.

In one aspect of the present disclosure, there is provided a coupling mechanism for coupling an electronic device to an outer casing, wherein the outer casing has an accommodation hole defined therein sized to correspond to a size of the electronic device, wherein the electronic device includes a front cover exposed out of the outer casing, and a rear cover coupled to a rear of the front cover the coupling mechanism comprising: a plurality of hook-shaped brackets interposed between the front and rear covers and wherein the plurality of hook-shaped brackets pass through the accommodation hole and are held to hook the outer casing while the front cover and the rear cover are coupled to each other; a plurality of main bracket-mounted portion defined in the front cover wherein each hook-shaped bracket is mounted into each main bracket-mounted portion; and a plurality of auxiliary bracket-mounted portion disposed on the rear cover wherein each auxiliary bracket-mounted portion is engaged with each hook-shaped bracket when the front cover and the rear cover are coupled to each other.

In one implementation, each hook-shaped bracket includes: a hooking portion held to hook the outer casing; a bracket body having the same width as the hooking portion and extending horizontally from one end of the hooking portion; first stoppers a integrally formed with the bracket body at both opposing sides thereof; and a second stopper vertically extending and then horizontally extending from one end of the bracket body and such that the second stopper faces away the bracket body.

In one implementation, the hook-shaped bracket is made of rigid metal, wherein when the electronic device is inserted into the accommodation hole, the hooking portion and the bracket body are pressed and elastically deformed, wherein after the electronic device has been inserted into the accommodation hole, the hooking portion and the bracket body are elastically restored such that the hooking portion is held to hook the outer casing.

In one implementation, each main bracket-mounted portion includes: a bracket-mounted groove defined in a second frame, wherein the second frame is coupled to a first frame along an edge thereof, wherein the first frame is coupled to a front face of the front cover wherein the groove is open toward the outer casing; both first ribs and both second ribs integrally formed with the second frame, wherein a receiving space for receiving the hook-shaped bracket is defined between the both first ribs and both second ribs.

In one implementation, the bracket-mounted groove has a width corresponding to a width of the hooking portion, wherein each of the first ribs includes an elongate bar, wherein the bar protrudes from an inner face of the second frame, wherein the bracket body are disposed between the bars of the first ribs, wherein each of the second ribs includes an elongate bar, wherein the bar protrudes from the inner face of the second frame, wherein each first stopper a and each second stopper are disposed between each first rib and each second rib, wherein each second rib is disposed below each first rib.

In one implementation, the first stopper a vertically downwardly extends and then horizontally outwardly extends from the bracket body, wherein the first stopper a has a horizontal dimension equal to a horizontal dimension of the first rib, wherein the first stopper a is in close contact with the first rib, wherein the second stopper is in close contact with the second rib.

In one implementation, the hook-shaped bracket includes a third stopper extending vertically downwardly from a distal end of the second stopper, wherein the auxiliary bracket-mounted portion protrudes in a plate form from an inner face of the rear cover and at a position corresponding to a position of the main bracket-mounted portion, wherein the auxiliary bracket-mounted portion contacts and presses against the third stopper when the front cover and the rear cover are coupled to each other.

In one implementation, the second stopper has a horizontal portion branching into a U shape, wherein each third stopper is formed at a distal end of each of prongs of the U shape.

In one implementation, the second stopper has a horizontal portion having a width greater than a width of the bracket body, wherein the third stopper is formed at a distal end of the second stopper.

In one implementation, each first stopper has a 90-degree rotated U shaped cross section such that the first stopper wraps the first rib.

According to the present disclosure, manufacturing the coupling mechanism for coupling the electronic device with a rigid material may allow the mechanism production cost to be reduced, and allow installation convenience of the device and durability of the mechanism to be improved. Further, improving the structure of the coupling mechanism may allow the electronic device to be installed by only one operator and may shorten the assembly time.

Further specific effects of the present disclosure as well as the effects as described above will be described in conduction with illustrations of specific details for carrying out the invention.

BRIEF DESCRIPTION OF THE DRAWINGS

FIG. 1 shows a conventional coupling structure for an electronic device.

FIG. 2 shows another conventional coupling structure for an electronic device.

FIG. 3 is a front view showing an electronic device mounted on an outer casing.

FIG. 4 is a back view showing the electronic device mounted on the outer casing.

FIG. 5 is an exploded perspective view of a coupling mechanism for coupling an electronic device, according to one embodiment of the present disclosure.

FIG. 6 is an enlarged perspective view of major components of FIG. 5.

FIG. 7 is a partial perspective view of a state in which a coupling mechanism for coupling an electronic device in FIG. 5 is mounted.

FIG. 8 is a side view showing a state before the electronic device is mounted on the outer casing using the coupling mechanism for coupling the electronic device according to an embodiment of the present disclosure.

FIG. 9 is a side view showing a state where the electronic device has been mounted on the outer casing using the coupling mechanism for coupling the electronic device according to an embodiment of the present disclosure.

FIG. 10 is a perspective view showing a coupling mechanism for coupling an electronic device according to another embodiment of the present disclosure.

FIG. 11 is a perspective view showing a coupling mechanism for coupling an electronic device according to still another embodiment of the present disclosure.

DETAILED DESCRIPTION

Hereinafter, a coupling mechanism for coupling an electronic device in accordance with the present disclosure will be described with reference to the accompanying drawings.

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

Unless defined otherwise, all terms used herein have the same meaning as commonly understood by one of ordinary skill in the art. When the terms used herein are in conflict with a general meaning of the term, the meaning of the term is in accordance with a definition used herein.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

FIG. 3 is a front view showing an electronic device mounted on an outer casing. FIG. 4 is a back view showing the electronic device mounted on the outer casing. The figures show only a portion of the outer casing.

As shown in FIG. 3 and FIG. 4, an electronic device 30 includes an HMI device or a panel PC, and has a panel shape having a predetermined thickness. The electronic device 30 may be installed into an separate outer casing 10. The outer casing 10 has an accommodation hole 12 defined therein having a size corresponding to a size of the electronic device 30.

The electronic device 30 has a front portion exposed to an outside from a front of the outer casing 10 and a rear portion corresponding to a rear of the outer casing 10. The electronic device 30 may include a front cover 100 that covers a portion of the front portion and a rear cover 300 that covers partially or entirely the rear portion.

The front cover 100 covers and supports an edge of the front portion of the electronic device 30. The front portion may be composed of, for example, a display on which an image is displayed. The front cover 100 has a shape that surrounds an edge of the display. A portion of the front cover exposed out of the outer casing 10 may be defined as a front portion of the front cover. A face of the front cover 100 facing forwardly may be defined as a front face thereof. A portion of the front cover facing rearwardly may be defined as a rear portion of the front cover. A face of the front cover 100 facing rearwardly may be defined as a rear face thereof. In this connection, FIG. 3 shows a front face of the outer casing 10 and FIG. 4 shows a rear face of the outer casing 10.

The front cover 100 may include a first frame 110 covering the front portion of the electronic device 30 and a second frame 130 covering a top, bottom, left and right edges of the device 30. A coupling device 500 for coupling the electronic device 30 to the outer casing 10 is disposed on the second frame 130 of the front cover 100.

The rear cover 300 is detachably coupled to the rear portion of the front cover 100. The rear cover 300 covers various components of the electronic device 30 to prevent exposure thereof to the outside. The rear cover 300 is coupled with the front cover 100 to prevent the coupling device 500, which will be described later, from moving.

FIG. 5 is an exploded perspective view of a coupling mechanism for coupling an electronic device, according to one embodiment of the present disclosure. FIG. 6 is an enlarged perspective view of major components of FIG. 5. FIG. 7 is a partial perspective view of a state in which a coupling mechanism for coupling an electronic device in FIG. 5 is mounted.

As shown in FIGS. 5 to 7, the coupling mechanism 500 is inserted between the front cover 100 and the rear cover 300. The coupling mechanism 500 is held in the accommodation hole 12 of the outer casing 10 while the front cover 100 and the rear cover 300 are coupled to each other. Thus, the coupling mechanism 500 allows the electronic device 30 to remain in a coupled state to the outer casing 10. To this end, the coupling mechanism 500 includes a hook-shaped bracket 510 held to hook the outer casing 10, a main bracket-mounted portion 530 defined in the front cover 100, and an auxiliary bracket-mounted portion 550 defined in the rear cover 300. The hook-shaped bracket 510 is held to hook the outer casing 10. The bracket-mounted portions into which the hook-shaped bracket 510 are mounted are also a key component of the present mechanism. Thus, in the present disclosure, the main bracket-mounted portion 530 and the auxiliary bracket-mounted portion 550 together with the hook-shaped bracket 510 constitutes the coupling mechanism 500.

As shown in FIG. 6, the hook-shaped bracket 510 is made of a rigid metal material. The hook-shaped bracket 510 is produced by bending a plate-shaped metal material a plurality of times. Thus, the hook-shaped bracket 510 has a predetermined elasticity. The hook-shaped bracket 510 may include a hooking portion 512 held to hook the outer casing 10, a bracket body 514 extending to one end of the hooking portion 512, first stoppers 514a extending from both side of the bracket body 514, and second stoppers 516 that extends and bends from one end of the bracket body 514. A distal end portion of the second stopper 516 is bent to form a third stopper 516a.

The hooking portion 512 is formed by bending a metal material having a predetermined width into a hook shape. A distal end of the hooking portion 512 is spaced apart from the bracket body 514 by a predetermined distance. Accordingly, when the hooking portion 512 passes through the accommodation hole 12 of the outer casing 10, the hooking portion 512 is deformed against a portion defining the accommodation hole 12 and is then inserted into the accommodation hole 12. After the hooking portion 512 has passed through the accommodation hole 12 of the outer casing 10, the hooking portion 512 is restored via an elasticity and caught on the rear face of the outer casing 10. This will be described later. For this purpose, the hooking portion 512 is oriented so that a small height side of the inclined portion is directed in the insertion direction of the hook-shaped bracket 510 into the outer casing.

The bracket body 514 has the same width as the hooking portion 512. The bracket body 514 extends in a direction away from the small height side of the hooking portion 512. Both first stoppers 514a extend vertically from both longitudinal-directional sides of the bracket body 514 respectively. The first stoppers 514s may stop a vertical movement of the main bracket-mounted portion 530 to be described later.

Each first stopper 514a is bent at a right angle toward the second stopper 516 by a width corresponding to a thickness of the main bracket-mounted portion 530 and then extends in a direction parallel to the bracket body 514. That is, the first stopper 514a is bent from the bracket body 514 at a right angle in an opposite direction to the hooking portion 512 and then is bent at a right angle to extend in a direction parallel to the bracket body 514. The first stopper 514a should not affect the insertion and resilient deformation of the hooking portion 512. Thus, the first stopper 514a is disposed in a region other than a region where the hooking portion 512 is formed.

The two second stoppers 516 extends from the bracket body 514, and are bent at a right angle downwardly and then bent at a right angle such that the two second stoppers 516 are parallel to the bracket body 514. The second stopper 516 should not affect the insertion and resilient deformation of the hooking portion 512. Accordingly, a pair of the second stoppers 516 may be formed into a U-shape by cutting and removing a middle portion of the plate by a width of the hooking portion 512. A distal end of each of the second stoppers 516 may be bent in the direction opposite to the hooking portion 512 to form each third stopper 516a.

The front cover 100 has the main bracket-mounted portion 530 defined therein corresponding to the shape of the hooking portion 512 of the hook-shaped bracket 510 and the shape of the first stopper 514a. The auxiliary bracket-mounted portion 550 corresponding to the shape of the third stopper 516a may be defined in the rear cover 300.

As shown in FIGS. 5 and 7, the front cover 100 is cut at plural locations in the second frame 130 to form plural grooves so that plural hook-shaped brackets 510 are inserted in the grooves respectively. The cut portion may define the main bracket-mounted portion 530.

Each main bracket-mounted portion 530 defines a substantially "90 degree-rotated U" shaped receiving space. The hook-shaped bracket 510 is inserted into the receiving space. The main bracket-mounted portion 530 includes an bracket-mounted groove 532 cut into the outer casing 10 and a first rib 534 and a second rib 536 defined integrally with the second frame 130 and defining a receiving space. The main bracket-mounted portion 530 includes a bracket-mounted groove 532 opening toward the outer casing 10, first ribs 534 and second ribs 536, both ribs being integral with the second frame 130. Each first rib 534 is spaced form each second rib 536.

The bracket-mounted groove 532 may receive the hooking portion 512 which is exposed outwardly. The bracket-mounted groove 532 is cut away by a width corresponding to the width of the hooking portion 512.

The first rib 534 is projected from the inner face of the second frame 130. The first ribs 534 may correspond to the two first stopper 514a respectively. The bracket body 514 may be disposed between the two first ribs 534. The above-mentioned first stopper 514a is vertically bent from the bracket body 514 by a vertical dimension of the first rib 534. Each first stopper 514a closely contacts each first rib 534. A horizontal portion of the first stopper 514a is in close contact with a bottom face of the first rib 534 as shown in FIG. 7. The first stopper 514a prevents the vertical movement of the hook-shaped bracket 510 on FIG. 7. Each first rib may be formed in an elongate bar.

The second rib 536 is projected from the inner face of the second frame 130. The second ribs 536 may correspond to the two second stopper 516 respectively. Both each first rib and each second rib are disposed between each second rib and each first rib. Each second rib may be formed in an elongate bar. Each second stopper 516 closely contacts each second rib 536. A horizontal portion of the second stopper 516 is in close contact with a top face of the second rib 536 as shown in FIG. 7. The second stopper 516 prevents the vertical movement of the hook-shaped bracket 510 on FIG. 7. Each third stopper 516a is inserted between each second rib 536 and a portion defining the auxiliary bracket-mounted portion 550.

In the above-described embodiment, the first rib 534 and the second rib 536 are formed in a bar shape, and the accommodation space in which the first and second stoppers of the hook-shaped bracket 510 are inserted is defined between the first rib 534 and the second rib 536. The present disclosure is not limited thereto. The main bracket-mounted portion may be constructed into a partially opened box shape such that a portion into which the hook-shaped bracket 510 is inserted and a portion through which the hooking portion 512 is exposed are opened and a remaining portion is blocked.

Referring to FIG. 5 and FIG. 7, the auxiliary bracket-mounted portion 550 is formed on the rear cover 300 from an inner face portion thereof coupled with the front cover 100. The auxiliary bracket-mounted portion 550 is defined at a position corresponding to the position of the hook-shaped bracket 510. The auxiliary bracket-mounted portion 550 protrudes from the inner face of the rear cover 300 toward the front cover 100. The auxiliary bracket-mounted portion 550 is in close contact with the third stopper 516a formed from the distal end of the second stopper 516 of the hook-shaped bracket 510 to press the third stopper 516a. Accordingly, the auxiliary bracket-mounted portion 550 prevents the hook-shaped bracket 510 from moving in the forward and backward directions on FIG. 5. Accordingly, the auxiliary bracket-mounted portion 550 protrudes from the rear cover 300 such that one side of the auxiliary bracket-mounted portion 550 is in close contact with the third stopper 516a when the coupling between the front cover 100 and the rear cover 300 occurs. Further, the auxiliary bracket-mounted portion 550 may have a shape such as a U-shape corresponding to the shape of the third stoppers 516a so as to sufficiently cover the third stoppers 516a and thus to closely contact the third stoppers 516a. Alternatively, the auxiliary bracket-mounted portion 550 may have a plate shape having a width equal to or greater than an outer width of the pair of third stoppers.

As described above, the hook-shaped bracket 510 is prevented from moving upward and downward with reference to FIG. 5 by the main bracket-mounted portion 530. The hook-shaped bracket 510 is prevented from moving back and forth by the auxiliary bracket-mounted portion 550. After mounting the hook-shaped bracket 510 into the main bracket-mounted portion 530, the front cover 100 and the rear cover 300 are mutually coupled to each other. Therefore, a state in which the hook-shaped bracket 510 is stably mounted on the front cover 100 may be maintained. Thus, the hook-shaped bracket 510 may not be released from the electronic device 30. Thus, the electronic device 30 may be stably mounted on the outer casing 10.

As described above, manufacturing the coupling mechanism for coupling the electronic device with the rigid material, the durability of the mechanism is improved, and the product cost is reduced. Further, this may prevent breakage of the coupling mechanism when coupling the device to the outer casing. Further, since the coupling mechanism may be simply inserted and installed, the installation convenience and workability are improved.

A process of installing the electronic device to the outer casing using the coupling mechanism for coupling the electronic device according to the embodiment of the present disclosure having the above-described configuration will be described as follows.

FIG. 8 is a side view showing a state before the electronic device is mounted on the outer casing using the coupling mechanism for coupling the electronic device according to an embodiment of the present disclosure. FIG. 9 is a side view showing a state where the electronic device has been mounted on the outer casing using the coupling mechanism for coupling the electronic device according to an embodiment of the present disclosure.

While the hook-shaped bracket 510 is coupled to the front cover 100, the rear cover 300 is coupled to the front cover 100 for subsequent installation of the electronic device 30. Then, the electronic device 30 is roughly coupled to the outer casing 10 via the process as described referring to FIG. 5 to FIG. 7.

As shown in FIG. 8, the electronic device 30 is inserted into the accommodation hole 12 in the outer casing 10. At this time, the electronic device 30 is inserted into the outer casing 10 in a direction from a front of the casing 10 to a rear thereof.

The hooking portion 512 of the hook-shaped bracket 510 is upwardly inclined in a direction toward the front cover 100. Therefore, the hooking portion 512 has a small height portion which is first inserted into the accommodation hole 12. The inclined portion is pressed while the rear cover 300 of the electronic device 30 passes through the accommodation hole 12.

The hooking portion 512 is pressed and is elastically deformed and thus a distal end of the hooking portion 512 approaches the bracket body 514 and passes through the accommodation hole 12. The hooking portion 512 is restored after passing through the accommodation hole 12. When the hooking portion 512 is restored, the hooking portion 512 is located out of the accommodation hole 12 on FIG. 9, so that the hooking portion 512 is held to hook the outer casing 10. Thus, the electronic device 30 is in a state in which the front cover 100 and the rear cover 300 thereof face each other with the outer casing 10 being disposed therebetween. The hook-shaped bracket 510 may thus allow an engagement between the electronic device 30 and the outer casing 10 to be maintained. Thus, the electronic device 30 is not detached from the outer casing 10 while the electronic device 30 is fully secured to the outer casing 10 using additional coupling means.

In this connection, the coupling state in which the electronic device 30 is roughly pre-coupled to the outer casing 10 before the electronic device 30 is completely fixed to the outer casing using additional coupling means may be referred to as "pre-coupling state" or "roughly coupling state". While the electronic device 30 is roughly pre-coupled to the outer casing 10, the electronic device 30 is fully secured to the outer casing 10 using additional coupling means. The coupling state in which the electronic device 30 is fixedly coupled to the outer casing 10 may be referred to as "post-coupling state" or "completely coupling state". In this process, the electronic device 30 can be installed to the outer casing only by a single operator.

Hereinafter, a coupling mechanism for coupling an electronic device according to another embodiment of the present disclosure will be described.

FIG. 10 is a perspective view showing a coupling mechanism for coupling an electronic device according to another embodiment of the present disclosure. FIG. 11 is a perspective view showing a coupling mechanism for coupling an electronic device according to still another embodiment of the present disclosure.

As shown in FIG. 10, a coupling mechanism 500' for coupling an electronic device according to another embodiment of the present disclosure is the same as the hook-shaped bracket 510 as described in the embodiment of FIG. 6 except that a second stopper 516' is free of a cut portion and is formed of a complete plate. When the hook-shaped bracket 510' has this construction, the hooking portion 512' may be elastically deformed because the hooking portion 512' and the second stopper 516' are spaced by a predetermined distance. Further, an area of the coupling mechanism as pressed by the auxiliary bracket-mounted portion (Refer to FIG. 5) increases. Thus, the installation stability of the hook-shaped bracket 510' is further improved.

Although not shown in the drawing, instead of forming the third stoppers by bending the distal end of the second stoppers, the second stoppers may be formed in the same manner as the second stoppers as described in FIG. 5 such that lengths of the second stoppers increase. Further, instead of the auxiliary bracket-mounted portion, the rear cover may have holes into which the second stoppers are inserted. In this case, since the second stoppers are inserted and fixed in the rear cover, this has the effect of restricting the forward-backward movement of the hook-shaped bracket like the embodiment of FIG. 5 in which the third stoppers are formed.

Alternatively, as shown in FIG. 11, a hook-shaped bracket 510" according to another embodiment of the present disclosure has the same structure as the embodiment described in FIG. 5, except that each of first stoppers 514a" has a 90-degree rotated U shaped cross section. In this case, since the first stopper 514a" wraps the first rib (See FIG. 7) of the main bracket-mounted portion 530", the upward and downward movement of the hook-shaped bracket 510" may be restricted as in the embodiment of FIG. 5. Therefore, the installation stability of the coupling mechanism is further improved.

Although the auxiliary bracket-mounted portion is described as being provided on the rear cover in the above embodiments, the present disclosure is not limited thereto. The auxiliary bracket-mounted portion may be formed as a separate component and may be coupled with the hook-shaped bracket. The auxiliary bracket-mounted portion is not limited to a specific shape as long as it can prevent the forward-backward movement of the hook-shaped bracket by securing the second stopper or the third stopper of the hook-shaped bracket.

It will be apparent to those skilled in the art that various modifications and variations may be made in the present invention without departing from the spirit of the present disclosure. The technical scope of the present disclosure is not limited to the contents described in the embodiments but should be determined by the claims and equivalents thereof

What is claimed is:

1. A coupling mechanism for coupling an electronic device to an outer casing, wherein the outer casing has an accommodation hole defined therein sized to correspond to a size of the electronic device, wherein the electronic device includes a front cover exposed out of the outer casing, and a rear cover coupled to a rear of the front cover, the coupling mechanism comprising:

a plurality of hook-shaped brackets interposed between the front and rear covers and, wherein the plurality of hook-shaped brackets pass through the accommodation hole and are held to hook the outer casing while the front cover and the rear cover are coupled to each other;

a plurality of main bracket-mounted portions defined in the front cover, wherein each of the plurality of hook-shaped brackets is mounted into each of the plurality of main bracket-mounted portions; and a plurality of auxiliary bracket-mounted portions disposed on the rear cover, wherein each of the plurality of auxiliary bracket-mounted portions is engaged with each of the plurality of hook-shaped brackets when the front cover and the rear cover are coupled to each other, wherein each of the plurality of hook-shaped brackets includes:

a hooking portion held to hook the outer casing;

a bracket body having a width that is same as a width of the hooking portion and extending horizontally from one end of the hooking portion;

first stoppers integrally formed with the bracket body at both opposing sides of the bracket body; and a second stopper vertically extending and then horizontally extending from one end of the bracket body and such that the second stopper faces away from the bracket body, wherein the plurality of hook-shaped brackets are made of rigid metal, wherein when the electronic device is inserted into the accommodation hole, the hooking portion and the bracket body are pressed and elastically deformed, wherein after the electronic device has been inserted into the accommodation hole, the hooking portion and the bracket body are elastically restored such that the hooking portion is held to hook the outer casing, wherein each of the plurality of main bracket-mounted portions includes:

a bracket-mounted groove defined in a second frame, wherein the second frame is coupled to a first frame along an edge thereof, wherein the first frame is coupled to a front face of the front cover, wherein the bracket-mounted groove is open toward the outer casing; and a pair of first ribs and a pair of second ribs integrally formed with the second frame, wherein a receiving space for receiving the plurality of hook-shaped brackets is defined between the pair of first ribs and the pair of second ribs.

2. The coupling mechanism of claim 1, wherein the bracket-mounted groove has a width corresponding to the width of the hooking portion, wherein each of the pair of first ribs includes an elongate bar, wherein the elongate bar of each of the pair of first ribs protrudes from an inner face of the second frame, wherein the bracket body is disposed between the bars of the pair of first ribs, wherein each of the pair of second ribs includes an elongate bar, wherein the elongate bar of each of the pair of second ribs protrudes from the inner face of the second frame, wherein the first stoppers and the second stopper are disposed between each of the pair of first ribs and each of the pair of second ribs, wherein each of the pair of second ribs is disposed below each of the pair of first ribs.

3. The coupling mechanism of claim 2, wherein each of the first stoppers vertically downwardly extends and then horizontally outwardly extends from the bracket body, wherein the first stopper each of the first stoppers has a horizontal dimension equal to a horizontal dimension of each of the pair of first ribs, wherein each of the first stoppers is in close contact with each of the pair of first ribs, wherein the second stopper is in close contact with the pair of second ribs.

4. The coupling mechanism of claim 3, wherein each of the plurality of hook-shaped brackets includes a third stopper extending vertically downwardly from a distal end of the second stopper, wherein each of the plurality of auxiliary bracket-mounted portions protrudes in a plate form from an inner face of the rear cover and at a position corresponding to a position of each of the plurality of main bracket-mounted portions, wherein each of the plurality of auxiliary bracket-mounted portions contacts and presses against the third stopper when the front cover and the rear cover are coupled to each other.

5. The coupling mechanism of claim 4, wherein the second stopper has a horizontal portion branching into a U shape, wherein the third stopper comprises a pair of third stoppers and each of the pair of third stoppers is formed at a distal end of each of prongs of the U shape.

6. The coupling mechanism of claim 4, wherein the second stopper has a horizontal portion having a width greater than the width of the bracket body, wherein the third stopper is formed at a distal end of the second stopper.

7. The coupling mechanism of claim 3, wherein each of the first stoppers has a 90-degree rotated U shaped cross section such that each of the first stoppers wraps each of the pair of first ribs.

* * * * *